(12) United States Patent
Todoroki et al.

(10) Patent No.: US 11,614,288 B2
(45) Date of Patent: Mar. 28, 2023

(54) HEAT EXCHANGER

(71) Applicant: NEC Corporation, Tokyo (JP)

(72) Inventors: Koichi Todoroki, Tokyo (JP); Minoru Yoshikawa, Tokyo (JP); Masaki Chiba, Tokyo (JP)

(73) Assignee: NEC CORPORATION, Tokyo (JP)

(*) Notice: Subject to any disclaimer, the term of this patent is extended or adjusted under 35 U.S.C. 154(b) by 93 days.

(21) Appl. No.: 16/923,615

(22) Filed: Jul. 8, 2020

(65) Prior Publication Data
US 2021/0010763 A1    Jan. 14, 2021

(30) Foreign Application Priority Data

Jul. 9, 2019 (JP) ............................. JP2019-127593

(51) Int. Cl.
| | | |
|---|---|---|
| F24F 13/30 | (2006.01) | |
| F28F 9/02 | (2006.01) | |
| H05K 7/20 | (2006.01) | |
| F28F 1/10 | (2006.01) | |
| F24F 1/0063 | (2019.01) | |
| F24F 1/0323 | (2019.01) | |

(52) U.S. Cl.
CPC .................. *F28F 9/02* (2013.01); *F28F 1/10* (2013.01); *H05K 7/208* (2013.01); *F24F 1/0063* (2019.02); *F24F 1/0323* (2019.02); *F24F 13/30* (2013.01)

(58) Field of Classification Search
CPC ............................... F24F 1/0059; F24F 1/0323
See application file for complete search history.

(56) References Cited

U.S. PATENT DOCUMENTS

| | | | | |
|---|---|---|---|---|
| 2,488,627 A * | 11/1949 | Hisey | ......................... | F28F 9/18 |
| | | | | 165/178 |
| 3,516,483 A * | 6/1970 | Benteler | ................ | F24F 5/0003 |
| | | | | 165/122 |
| 3,827,483 A * | 8/1974 | Hopkinson | ................ | F24F 1/06 |
| | | | | 165/122 |
| 4,562,697 A * | 1/1986 | Lawson | ................. | F28F 9/0202 |
| | | | | 60/599 |
| 4,595,051 A * | 6/1986 | Cadars | ............... | B60H 1/00321 |
| | | | | 165/122 |
| 4,805,418 A * | 2/1989 | Ishizuka | ............... | F24F 1/0014 |
| | | | | 165/122 |
| 4,934,449 A * | 6/1990 | Watt | ........................ | B60K 11/08 |
| | | | | 165/41 |

(Continued)

FOREIGN PATENT DOCUMENTS

| | | |
|---|---|---|
| JP | S59-120376 U | 8/1984 |
| JP | 2012-163274 A | 8/2012 |

(Continued)

*Primary Examiner* — Leonard R Leo
(74) *Attorney, Agent, or Firm* — Sughrue Mion, PLLC (57) ABSTRACT

A heat exchanger has a structure in which a heat exchanger main body through which coolant flows is obliquely installed in a box-shaped enclosure, the heat exchanger main body is constituted by a header pipe and a plurality of heat transfer pipes connected to the header pipe and disposed at predetermined intervals along a surface of a part of the header pipe, the header pipe has an area adjacent to an inner surface of the enclosure, and a seal section is provided between the inner surface of the enclosure and the area of the header pipe adjacent to the enclosure.

7 Claims, 5 Drawing Sheets

(56) References Cited

U.S. PATENT DOCUMENTS

| | | | | |
|---|---|---|---|---|
| 5,046,554 A | * | 9/1991 | Iwasaki | B60K 11/04 |
| | | | | 165/127 |
| 7,367,384 B2 | * | 5/2008 | Madara | G06F 1/203 |
| | | | | 165/122 |
| 2019/0234626 A1 | | 8/2019 | Onaka et al. | |

FOREIGN PATENT DOCUMENTS

| | | |
|---|---|---|
| JP | 2015-227754 A | 12/2015 |
| WO | 2018/047332 A1 | 3/2018 |

* cited by examiner

HEAT EXCHANGER

This application is based upon and claims the benefit of priority from Japanese patent application No. 2019-127593, filed Jul. 9, 2019, the disclose of which is incorporated herein in its entirety by reference.

TECHNICAL FIELD

The present invention relates to a heat exchanger capable of increasing heat exchange efficiency.

BACKGROUND ART

In a data center in which a large number of electronic instruments are densely disposed, generation of a large amount of heat can be expected. A heat exchange system employing a cooling system and configured to exhaust the heat generated by the electronic instruments is provided, in which a processing capacity thereof can be maintained even when a large amount of heat is generated during a high load operation of the electronic instruments. The cooling system is a system that involves heat transfer due to phase changes that are referred to as evaporation and condensation of coolant.

Then, in such a heat exchange system, a heat exchanger configured to perform heat exchange between heat discharged from electronic instruments and a coolant is provided.

For example, in an air conditioner disclosed in Japanese Unexamined Patent Application, First Publication No. 2012-163274 (hereinafter Patent Document 1), a main body casing, an air outlet port provided on the main body casing, a heat exchanger provided in the main body casing and configured to cool air suctioned from the outside, and a fan disposed below the heat exchanger and configured to blow air are provided. The main body casing is constituted by a front panel, side panels, a rear panel, and a bottom panel.

Japanese Unexamined Patent Application, First Publication No. 2015-227754 (hereinafter Patent Document 2) discloses a specific configuration related to a heat exchanger.

In the heat exchanger disclosed in Patent Document 2, an upper header provided in a horizontal direction, a lower header provided parallel to the upper header, and a plurality of flat tubes are accommodated in a casing that forms an outer shell. The plurality of flat tubes are provided between the upper header and the lower header and disposed to be inclined with respect to a vertical direction.

In a heat exchanger disclosed in No. WO2018/047332 (hereinafter Patent Document 3), an example in which a cross-sectional shape of a header is formed in a round shape, an elliptical shape, a semi-circular shape or a triangular shape is disclosed.

SUMMARY

The present invention is directed to providing a heat exchanger capable of simultaneously improving vibration damping and thermal insulation performance while increasing heat exchange efficiency.

In order to solve the problems, the present invention proposes the following means.

That is, the present invention provides a heat exchanger in which a heat exchanger main body through which a coolant flows is obliquely installed in a box-shaped enclosure, wherein the heat exchanger main body is constituted by a header pipe configured to perform supply and discharge of coolant, and a plurality of heat transfer pipes connected to the header pipe and disposed at predetermined intervals along a surface of part of the header pipe, the header pipe has an area adjacent to an inner surface of the enclosure, and a seal section is provided between the inner surface of the enclosure and the area of the header pipe adjacent to the enclosure.

EXAMPLE EMBODIMENT

Hereinafter, example embodiments of the present invention will be described, but the following example embodiments do not restrict the invention according to the claims. In addition, not all combinations of the features described in the example embodiments are essential to the solution of the invention.

Figure 1:
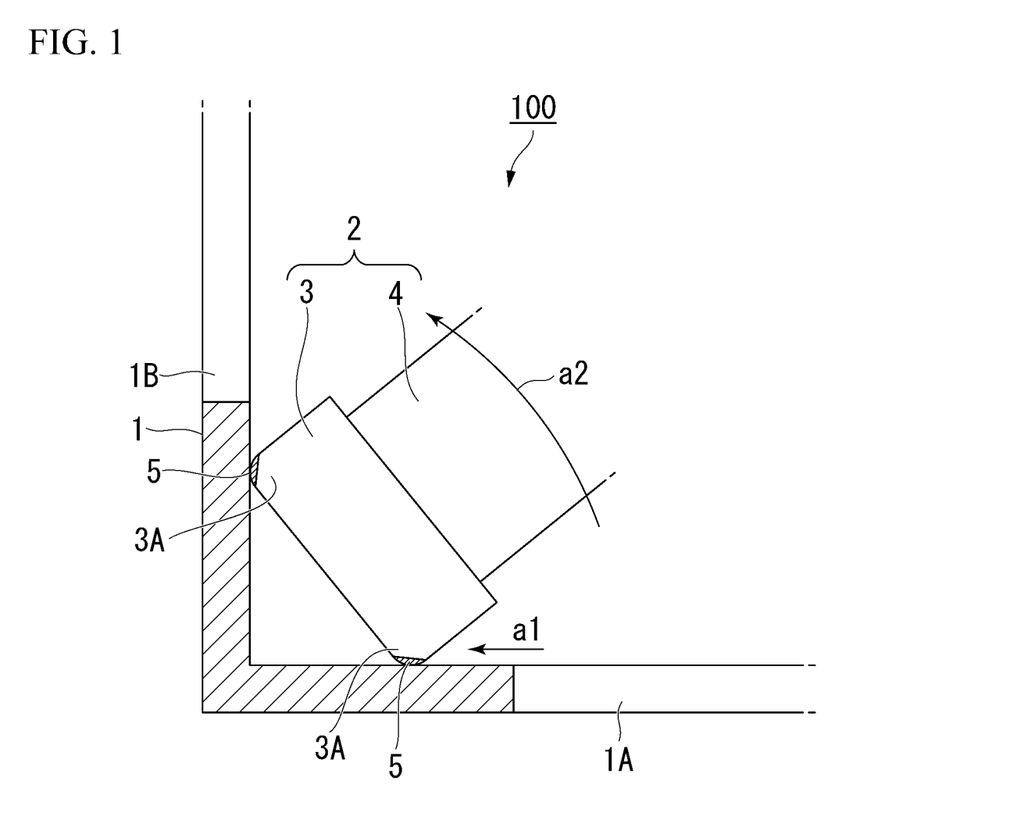
FIG. 1 is a schematic configuration view showing a minimum configuration example of a heat exchanger according to the present invention.

A heat exchanger 100 according to the present invention will be described with reference to FIG. 1.

The heat exchanger 100 has a structure in which a heat exchanger main body 2 through which coolant flows is obliquely installed in an enclosure 1. That is, the heat exchanger main body 2 through which the coolant flows is obliquely disposed in a space in the enclosure 1.

The enclosure 1 is formed in a box shape, air containing waste heat from electronic instruments that are cooling targets is taken from an opening section 1A formed on one side of the enclosure 1, and air after heat exchange through the heat exchanger main body 2 is discharged from an opening section 1B formed on the other side.

The heat exchanger main body 2 is constituted by a header pipe 3 configured to perform supply and discharge of coolant, and a plurality of heat transfer pipes 4 connected to the header pipe 3 and disposed to be arranged at predetermined intervals along a surface of a part of the header pipe 3. The plurality of heat transfer pipes 4 are disposed at intervals in a direction perpendicular to the drawing. Then, when air passes between the plurality of heat transfer pipes 4 disposed in this way, heat exchange is performed between the coolant in the heat transfer pipes 4 and the air.

The header pipe 3 has an area 3A adjacent to an inner surface of the enclosure 1. A seal section 5 is provided between the inner surface of the enclosure 1 and the area 3A of the header pipe 3 adjacent to the enclosure 1.

Further, for example, an elastically deformable material such as a rubber or the like may be used for the seal section 5. In addition, the seal section 5 may be formed by providing micro gaps between the header pipe 3 and the inner surface of the enclosure 1, in which flow of leaked air cannot easily occur.

Then, according to the heat exchanger 100 configured as above, the seal section 5 is provided between the inner surface of the enclosure 1 and the header pipe 3 adjacent to the inner surface of the enclosure 1. For this reason, it is possible for the seal section 5 to prevent the air that is a cooling target from leaking into a space between the header pipe 3 and the inner surface of the enclosure 1 and generation of a flow of leaked air (shown by an arrow a1).

Accordingly, in the heat exchanger 100, most of the air flowing through the heat exchanger main body 2 can be guided toward the heat transfer pipes 4 (shown by an arrow a2). For this reason, heat exchange can be efficiently performed by the heat transfer pipes 4.

Incidentally, a fan motor may be installed in the same enclosure 1 or may be attached to an outward side of the enclosure 1. This may cause the enclosure 1 to vibrate. In addition, in order to efficiently exchange heat of air that intentionally flows, it is preferred that no heat exchange occur between members other than air and the heat exchanger 100 as far as possible. In other words, the heat exchanger 100 preferably has high thermal insulation performance with respect to members other than air. In the heat exchanger 100, heat transfer between the enclosure 1 and the heat exchanger main body 2 is blocked while vibrations of the heat exchanger main body 2 are suppressed even when the enclosure 1 is vibrated by the seal section 5 provided between the inner surface of the enclosure 1 and the header pipe 3. Accordingly, thermal insulation performance of the heat exchanger main body 2 with respect to members other than air can be simultaneously improved.

Embodiment

A heat exchanger 101 according to the embodiment of the present invention will be described with reference to FIG. 2 to FIG. 5.

Figure 2:
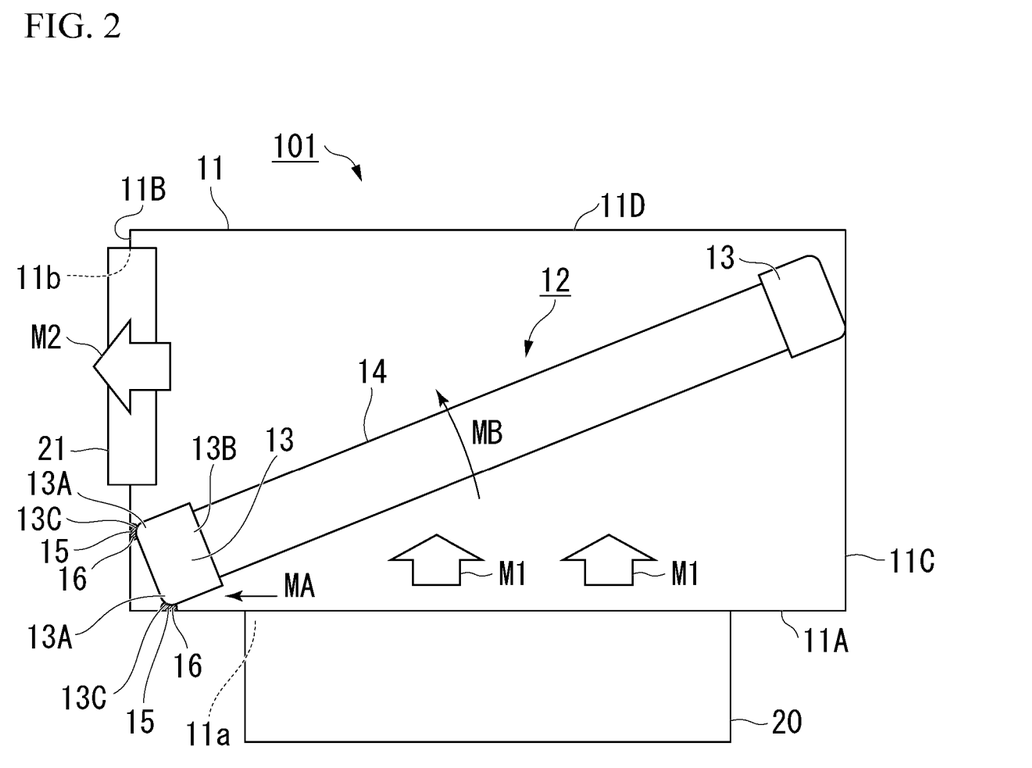
FIG. 2 is a schematic configuration view showing a heat exchanger according to an embodiment of the present invention.

As shown in FIG. 2, for the purpose of reduction in space, the heat exchanger 101 employs a structure in which a heat exchanger main body 12 through which coolant flows is obliquely installed in the enclosure 11.

The enclosure 11 is formed of metal plates in a box shape, and a bottom surface 11A, side surfaces 11B and 11C and an upper surface 11D are shown in FIG. 2.

A lower opening section 11a into which air containing waste heat from electronic instruments that are cooling targets flows is formed in the bottom surface 11A of the enclosure 11. In addition, a side surface opening section 11b configured to discharge cooling air passing through the heat exchanger main body 12 after heat exchange is formed in the left side surface 11B of the enclosure 11.

That is, air containing waste heat from electronic instruments that are cooling targets is taken into the enclosure 11 from the lower opening section 11a formed in the bottom surface 11A (shown by reference sign M1). In addition, in the enclosure 11, cooling air after heat exchange through the heat exchanger main body 12 is discharged from the side surface opening section 11b formed in the left side surface 11B (shown by reference sign M2).

In addition, air blowers 20 and 21 configured to perform supply and discharge of air that is a cooling target with respect to the enclosure 11 are installed in the lower opening section 11a and the side surface opening section 11b of the enclosure 11. Fan motors are installed in the air blowers 20 and 21.

The heat exchanger main body 12 is constituted by header pipes 13 configured to perform supply and discharge of coolant, and a plurality of heat transfer pipes 14 disposed to be arranged at predetermined intervals in an extending direction of the header pipes 13 and connected to the header pipes 13.

The header pipes 13 are installed to extend in a direction perpendicular to the paper surface of the drawing. As shown in FIG. 2, the header pipes 13 are installed at positions on both sides of each of the heat transfer pipes 14.

The heat transfer pipes 14 are installed with a positional relation in which the extending direction of the heat transfer pipes 14 is perpendicular to the extending direction of the header pipes 13. In addition, the plurality of heat transfer pipes 14 are provided at intervals in the direction perpendicular to the drawing, each of which is constituted by a flat tube. Here, the reason for employing a flat shape for the heat transfer pipes 14 is that heat exchange efficiency is increased because a cross-sectional area of the flat shape is larger than that of a circular tube, and thus, a heat exchange area for exchanging heat between the air and the coolant is increased.

Then, in the heat transfer pipes 14 constituted by such flat tubes, since the coolant supplied through the header pipes 13 flows into the heat transfer pipes 14, heat of the air that is a cooling target is absorbed via pipe walls of the heat transfer pipes 14, and the air is cooled.

The heat exchanger main body 12 is a structure that is obliquely installed as a whole. For example, in the example, the header pipes 13 positioned at a lower end shown in FIG. 2 are installed at positions close to corners between the bottom surface 11A and the left side surface 11B of the enclosure 11. In addition, the header pipes 13 disposed at an upper end shown in FIG. 2 are installed at positions close to corners between the upper surface 11D and the right side surface 11C of the enclosure 11.

The header pipes 13 have areas 13A close to the inner surface of the enclosure 11, and seal sections 15 are provided between the inner surface of the enclosure 11 and the areas 13A of the header pipes 13 close to the enclosure 11.

Figure 3:
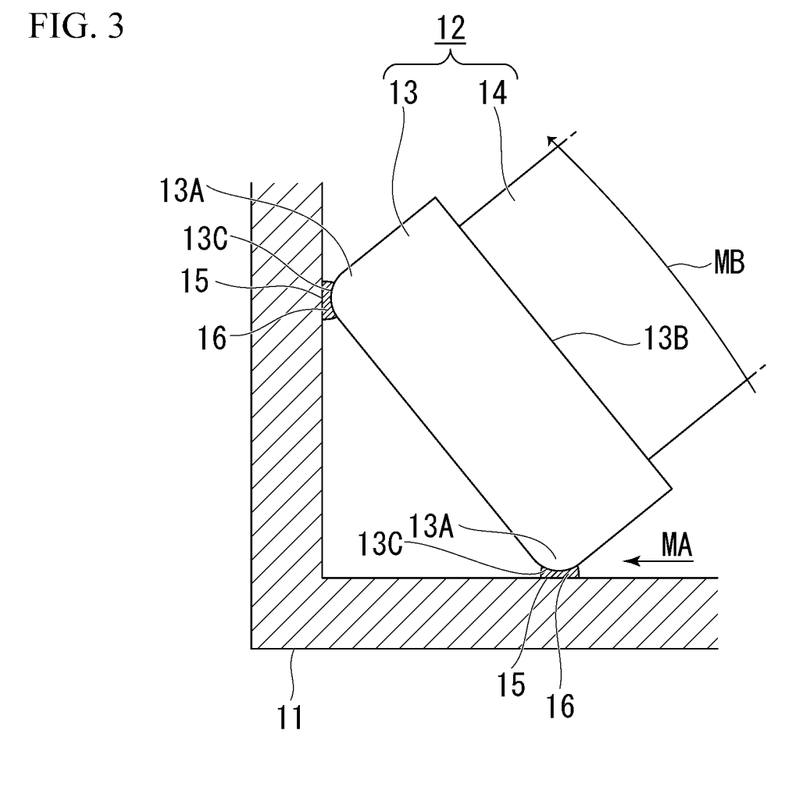
FIG. 3 is a view showing an end portion of a heat exchanger main body.

As will be appreciated with reference to an enlarged view of FIG. 3, the seal sections 15 prevent a flow of leaked air (shown by an arrow MA) in which air that is a cooling target leaks between the header pipes 13 and the inner surface of the enclosure 11. Moreover, the seal sections 15 guide most of the air flowing around the heat exchanger main body 12 toward the heat transfer pipes 14 (shown by an arrow MB). Accordingly, the seal sections 15 enable efficient heat exchange in the heat transfer pipes 14.

Further, an elastically deformable elastic material 16 such as a rubber material as shown in FIG. 3, preferably, a material having a porous structure and enhanced thermal insulation and vibration proof properties is used as the seal sections 15. In addition, micro gaps in which leaked air flows cannot be easily formed between the header pipes 13 and the inner surface of the enclosure 11 may be formed as the seal sections 15 (this will be described below with reference to FIG. 4).

In addition, the header pipes 13 have a cross-sectional shape that is a quadrangular shape as a whole, portions connecting to the heat transfer pipes 14 are formed in a planar shape (a planer section is designated by reference sign 13B), and a portion other than a planer section 13B is formed in a curved surface shape (a curved surface section is designated by reference sign 13C).

In addition, curved surface sections 13C of the header pipes 13 coincide with the areas 13A of the header pipes 13 adjacent to the inner surface of the enclosure 11. That is, the curved surface sections 13C are adjacent to the inner surface of the enclosure 11 as shown in the areas 13A.

Then, according to the curved surface sections 13C of the above-mentioned header pipes 13, it is possible to prevent a load concentrated on the seal sections 15 formed of the elastic material 16 such as rubber or the like from being applied as in the case of employing the header pipe formed in a rectangular shape. Accordingly, according to the curved surface sections 13C, deterioration and breakage of the seal sections 15 are prevented.

Figure 4:
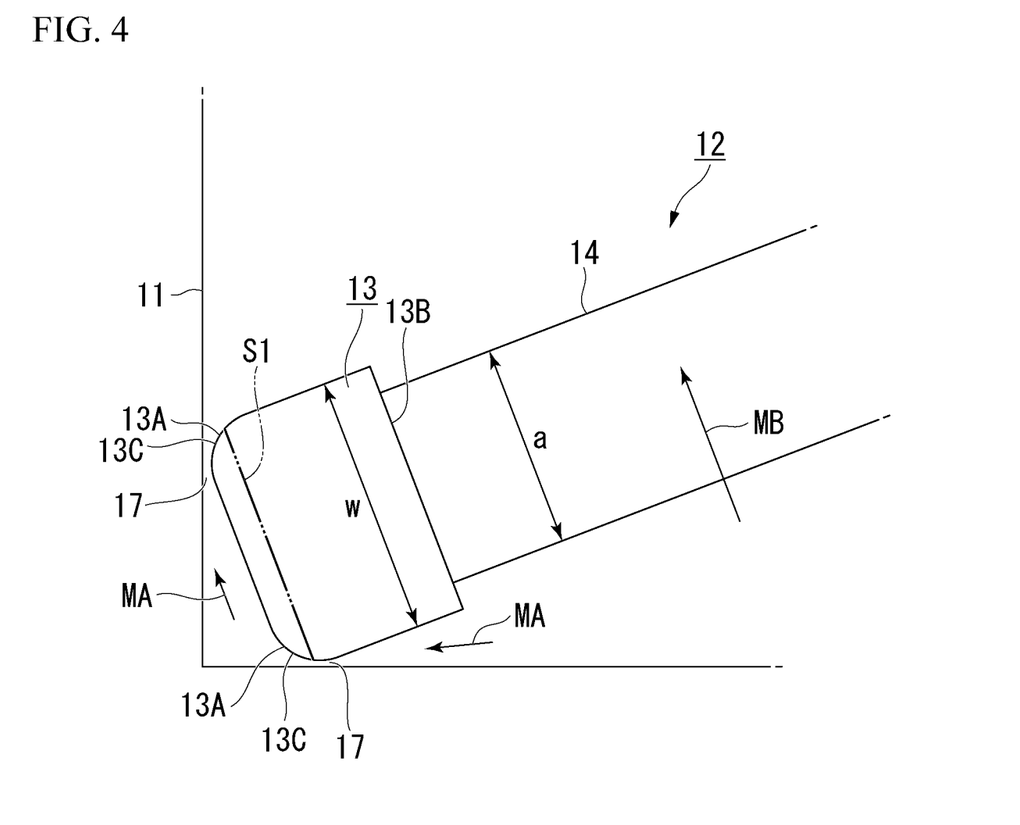
FIG. 4 is a view for describing a dimension of the heat exchanger.

Further, in the above-mentioned header pipes 13, the areas 13A of the header pipes 13 adjacent to the inner surface of the enclosure 11 are formed on the curved surface sections 13C. Accordingly, in comparison with the case in which the curved surface shown by a dashed line S1 in FIG. 4 is not used, a cross-sectional area of the header pipes 13 can be increased. That is, since the cross-sectional area of the header pipes 13 is increased by forming the curved surface sections 13C, pressure loss of coolant flowing through the header pipes 13 is minimized, and the coolant flowing into the header pipes 13 can be diverted into the heat transfer pipes 14 with little deviation when the coolant is diverted into the heat transfer pipes 14.

In addition, FIG. 4 shows an example in which the seal sections 15 are formed by micro gaps 17 in which a leaked air flow between the header pipes 13 and the inner surface of the enclosure 11 cannot be easily formed.

The header pipes 13 need to be separated from the enclosure 11 such that heat transfer in the bottom surface 11A (FIG. 2) and/or the side surface 11B (FIG. 2) of the enclosure 11 does not occur. However, since space efficiency deteriorates when the header pipes 13 and the enclosure 11 are excessively separated from each other, it is preferable that the gaps 17 be separated by a minute distance of about 0.1 to 2 mm.

That is, in the header pipes 13, it is possible to form the micro gaps 17 that do not reduce the cross-sectional area using the curved surfaces, and thus, an effect of curbing the above-mentioned leaked air flow (shown by an arrow MA) is obtained.

In addition, a ratio of a diameter (w2) of the heat transfer pipes 14 to a diameter (w1) of the header pipes 13 is preferably equal to or more than 0.5 and less than 1. Accordingly, in the heat exchanger 101, both of reduction in size of the header pipes 13 and improvement in heat exchange efficiency due to an increase in width of the heat transfer pipes 14 are accomplished.

Figure 5:
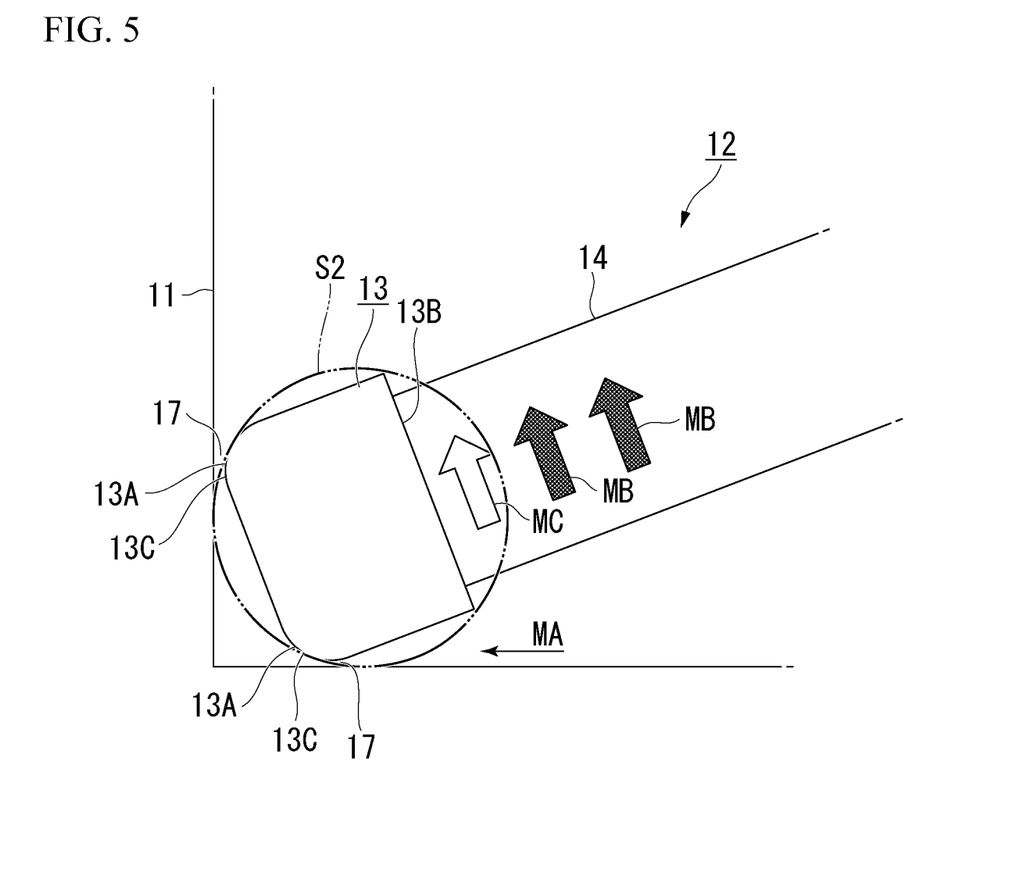
FIG. 5 is a view for describing a flow of air in the heat exchanger.

In addition, in the heat exchanger 101, as shown in FIG. 5, the area of the header pipe 13 to which the heat transfer pipe 14 is connected is referred to as the planer section 13B. Accordingly, in comparison with the case in which a cross section of the header pipe 13 is a circular shape (in the case of a circular shape shown by a chain line S2 in FIG. 5), a contact area of the heat transfer pipe 14 with the air flow is increased.

Accordingly, in the heat exchanger 101, in addition to circulation of conventional air to be cooled (shown by an arrow MB), air flow passing between the heat transfer pipes 14 can be increased (shown by an arrow MC). As a result, heat exchange efficiency can be improved. That is, since the area of the header pipe 13 to which the heat transfer pipe 14 is connected becomes the planer section 13B, air flowing between the plurality of heat transfer pipes 14 can be increased.

Further, in the heat exchanger 101, in order to increase an exposed area of the heat transfer pipes 14 without changing the outline size (a length between the two end portions of the header pipes 13), the following is conceivable. That is, it is considered that the heat transfer pipes 14 and the header pipes 13 be connected at positions where lengths of the heat transfer pipes 14 are increased by that amount according to using a cylindrical header pipe having a smaller diameter than that of a chain line S2 shown in FIG. 5. However, in this case, a proportion of the area of the heat transfer pipe 14 entering the header pipe 13 is increased by increasing a ratio of an arc of a connecting part used for connection to the heat transfer pipe 14. For this reason, an effective internal cross-sectional area in the header pipe 13 is reduced, and thus, pressure loss is increased. Accordingly, there is a problem that the heat exchange efficiency deteriorates due to occurrence of an uneven distribution of the flow of coolant into each heat transfer pipes 13.

That is, in the heat exchanger 101, the area of the header pipe 13 to which the heat transfer pipe 14 is connected becomes the planer section 13B. Accordingly, the heat exchange efficiency of the heat exchanger can be increased by equalizing the flows of the coolant while an operation of attachment of the heat transfer pipes 14 is facilitated. In addition, in the heat exchanger 101, the coolant passing through the heat exchanger main body 12 is preferably of a low pressure type (for example, coolant having a pressure in the heat exchanger main body 12 of 0.5 to 3).

Accordingly, the heat exchanger 101 can withstand an internal pressure even when a connecting surface of the header pipe 13 to the heat transfer pipe 14 is a flat surface.

According to the heat exchanger 101 having the above-mentioned configuration, the elastically deformable material 16 such as a rubber material or the like or the seal sections 15 constituted by the micro gaps 17 are provided between the inner surface of the enclosure 11 and the header pipes 13 adjacent to the inner surface of the enclosure 11. For this reason, it is possible for the seal sections 15 to prevent the air that is a cooling target from flowing between the header pipes 13 and the inner surface of the enclosure 11 (shown by an arrow MA).

Accordingly, in the heat exchanger 101, most of the air flowing through the heat exchanger main body 12 (shown by an arrow MB) can be guided toward the heat transfer pipes 14, and efficient heat exchange can be performed by the heat transfer pipes 14.

At the same time, in the heat exchanger 101, heat transfer between the enclosure 11 and the heat exchanger main body 12 is blocked, and thermal insulation performance of the heat exchanger main body 12 is also simultaneously improved. Accordingly, heat exchange efficiency can be improved.

In addition, in the heat exchanger 101, when the seal sections 15 formed of the elastically deformable material 16 such as a rubber material or the like are provided between the inner surface of the enclosure 11 and the header pipes 13, the rubber or the like is elastically deformed. Accordingly, it is possible to prevent vibrations generated in the heat exchanger due to a phase change and noise due to vibrations from being transmitted to the enclosure and being amplified. Further, it is possible to avoid inconvenience that noise is amplified by the vibrations of the fan motor transmitted to the heat exchanger main body via the enclosure.

Further, in the embodiment, after the air that is the cooling target is suctioned from below the heat exchanger main body 12 and a lower surface side of the enclosure 11, the air after heat exchange is discharged from above the heat exchanger main body 12 and a lateral side of the enclosure 11.

However, as shown in the embodiment, the flow of the air is not limited, and the air may be suctioned from either side of the enclosure 11 as long as it is below the heat exchanger main body 12. Similarly, the air may be discharged from either side of the enclosure 11 as long as it is above the heat exchanger main body 12.

In addition, the air is not limited to being circulated from below to above the heat exchanger main body 12 as shown in the embodiment and may be circulated from above to below the heat exchange main body 12.

In addition, while the seal sections are provided at two places in the drawings, a seal section may be provided at one place. In this case, from a viewpoint of thinning the entire device in an upward/downward direction, it is preferable to a seal section on position with a positional relationship in which the header pipe and the inner surface of the enclosure are above and below each other.

In addition, in the embodiment, while the air taken from the outside by the heat exchanger main body 12 is cooled, there is no limitation thereto, and the air may be heated by the heat exchanger main body 12.

As mentioned above, several technologies have been proposed in relation to a heat exchanger.

Patent Documents 1 and 2 disclose a configuration in which a heat exchanger constituted by a header and a flat tube is obliquely disposed in a box-shaped enclosure.

However, in the heat exchanger having such a shape, there have been no cases of specifically examining how to design each part in order to accomplish both of consideration of a flow of air that is a cooling target and improvement in space efficiency and heat exchange efficiency for reduction in thickness.

For example, in such a heat exchanger, there is a need to specifically review how an air flow flowing between a wall surface of a casing and a header pipe and an air flow passing through a flat pipe affect heat exchange and to increase efficiency of heat exchange.

In addition, in the heat exchanger disclosed in Patent Document 3, an example in which a cross-sectional shape of a header is a round shape, an elliptical shape, a semi-circular shape or a triangular shape is disclosed. However, no verification about heat exchange efficiency of a heat exchanger due to presence of a header having such a shape has been performed.

Further, even in a heat exchanger disclosed in Japanese Utility Model Publication No. S59-120376, there is no disclosure that verifies heat exchange efficiency according to a shape of a header.

According to the present invention, it is possible to obtain a heat exchanger capable of increasing heat exchange efficiency.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A heat exchanger comprising:
an enclosure that is box-shaped; and
a heat exchanger main body through which coolant flows is obliquely installed in the enclosure,
wherein the heat exchanger main body includes a header pipe configured to perform supply and discharge of coolant, and a plurality of heat transfer pipes connected to the header pipe and disposed at predetermined intervals along a surface of part of the header pipe,
the header pipe has an area adjacent to an inner surface of the enclosure,
the heat exchanger further includes a seal section that is provided between the inner surface of the enclosure and the area of the header pipe adjacent to the enclosure, and
the seal section is formed by a micro gap formed between the header pipe and the inner surface of the enclosure,
wherein the micro gap permits air flow from an upstream side to a downstream side of the heat exchanger, and
wherein a size of the micro gap is in a range of about 0.1 mm to 2 mm.

2. The heat exchanger according to claim 1, wherein the header pipe has places to which the heat transfer pipes are connected, the places each being formed in a flat surface shape.

3. The heat exchanger according to claim 2, wherein the header pipe has a portion formed in a curved surface shape other than the connecting places while a cross-sectional shape is formed in a quadrangular shape, and
the seal section is provided on a curved surface section of the header pipe.

4. The heat exchanger according to claim 2, wherein a ratio of a diameter of the heat transfer pipe with respect to a diameter of the header pipe at the connecting place is 0.5 or more and less than 1.

5. The heat exchanger according to claim 1, wherein, in the enclosure, air containing heat is suctioned from a lower opening disposed below the heat exchanger main body that is obliquely installed, and the air after cooling is discharged from an upper opening disposed above the heat exchanger main body.

6. The heat exchanger according to claim 5, wherein an air blower configured to supply the air into the enclosure is provided in each of the lower opening and the upper opening of the enclosure.

7. The heat exchanger according to claim 1, wherein a pressure of the coolant flowing through the heat exchanger main body is 0.5 atm or more and 3 atm or less.

* * * * *